US012622317B2

(12) United States Patent
Elsherbini et al.

(10) Patent No.: US 12,622,317 B2
(45) Date of Patent: May 5, 2026

(54) PACKAGING ARCHITECTURE FOR MODULAR DIE INTEROPERABILITY

(71) Applicant: Intel Corporation, Santa Clara, CA (US)

(72) Inventors: Adel A. Elsherbini, Tempe, AZ (US); Stephen R. Van Doren, Portland, OR (US); Ritu Gupta, Sunnyvale, CA (US); Gerald S. Pasdast, San Jose, CA (US); Robert J. Munoz, Round Rock, TX (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 362 days.

(21) Appl. No.: 17/557,622

(22) Filed: Dec. 21, 2021

(65) Prior Publication Data

US 2023/0197677 A1 Jun. 22, 2023

(51) Int. Cl.
H01L 25/065 (2023.01)
(52) U.S. Cl.
CPC .................... H01L 25/0652 (2013.01); H01L 2225/06548 (2013.01)

(58) Field of Classification Search
None
See application file for complete search history.

(56) References Cited

U.S. PATENT DOCUMENTS

| | | | |
|---|---|---|---|
| 9,653,428 B1 | 5/2017 | Hiner et al. | |
| 12,062,648 B2 * | 8/2024 | Popovic | H01L 25/105 |
| 2020/0035603 A1 * | 1/2020 | Rubin | H01L 24/16 |
| 2020/0098692 A1 * | 3/2020 | Liff | H01L 23/5386 |
| 2020/0105718 A1 * | 4/2020 | Collins | H01L 25/18 |
| 2021/0125967 A1 | 4/2021 | Zhai | |
| 2021/0256654 A1 | 8/2021 | Koker et al. | |

* cited by examiner

*Primary Examiner* — Long Pham
(74) *Attorney, Agent, or Firm* — Akona IP PC

(57) ABSTRACT

A microelectronic assembly is provided comprising: a first plurality of integrated circuit (IC) dies arranged in an array of rows and columns in a first layer; and a second plurality of IC dies in a second layer not coplanar with the first layer. A first IC die in the first plurality is differently sized than surrounding IC dies in the first plurality, and a second IC die in the second plurality coupled to the first IC die comprises at least one of: a repeater circuitry and a fanout structure in an electrical pathway coupling the first IC die with an adjacent IC die in the first plurality.

20 Claims, 7 Drawing Sheets

PACKAGING ARCHITECTURE FOR MODULAR DIE INTEROPERABILITY

TECHNICAL FIELD

The present disclosure relates to techniques, methods, and apparatus directed to packaging architecture for modular die interoperability in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figures 1, 2A, 2B:
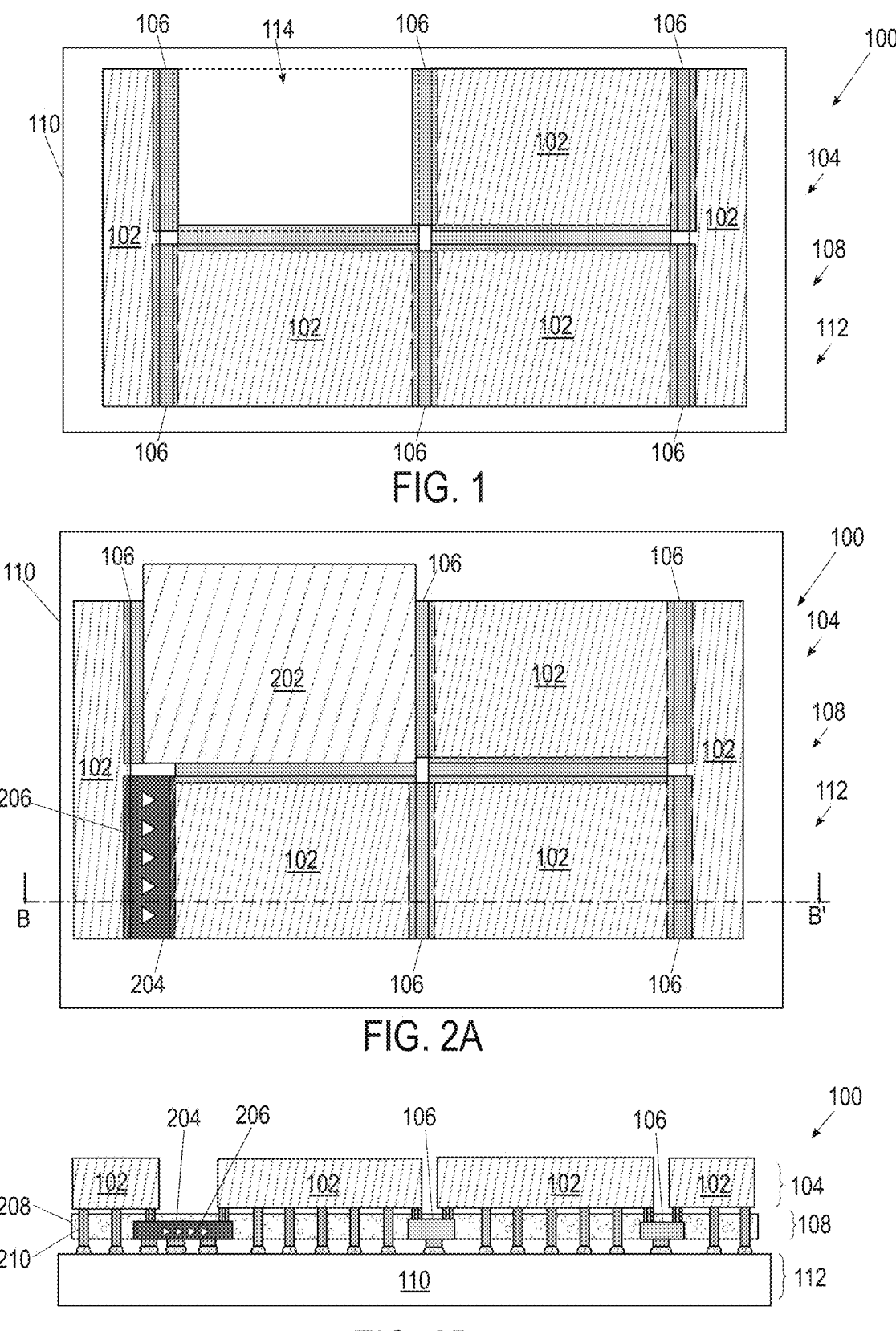
FIG. 1 is a simplified top view of an example microelectronic assembly, according to some embodiments of the present disclosure.
FIG. 2A is a simplified top view of another example microelectronic assembly, according to various embodiments of the present disclosure.
FIG. 2B is a simplified cross-sectional view of the example microelectronic assembly of FIG. 2A.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected together to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different dies, each one optimized in terms of design and manufacturing, the overall yield and cost of the combined die solution may be improved.

The connectivity between these dies is achievable by many different ways. For example, in 2.5D packaging solutions, a silicon interposer and through-substrate vias (TSVs) connect dies at silicon interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C4 interconnections). The EMIB and the 3D stacked architecture may also be combined using an omni-directional interconnect (ODI), which allows for top-packaged chips to communicate with other chips horizontally using EMIB and vertically, using Through-Mold Vias (TMVs) which are typically larger than TSVs.

However, as the number of individual IC dies integrated onto a single microprocessor or other such system-in-package increases, the footprint available on a fixed-size package substrate for interconnecting these IC dies becomes challenging. To help alleviate the footprint challenge, IC dies may be sized to be uniform and arranged in a grid pattern in a tiled compute architecture. This tiling allows adding more core complex IC dies or replacing the input/output (IO) dies to fit different products. As used herein, the terms "core complex," and "core" are used interchangeably to refer to a circuit comprising a reusable unit of logic, cell, or IC layout design with a particular functionality and defined interface, which serves as a building block in an IC chip design. For example, cores may comprise a set of memory registers, arithmetic logic unit (ALU), power converters, high-speed I/O interfaces, peripherals, programmable microprocessors, micro-controllers, digital signal processors, analog-digital mixed-signal processing blocks, configurable computing architectures, etc. A smaller core (e.g., computing core) may be combined with other smaller cores (e.g., memory) to form a larger core. For example, a core may comprise a computing core coupled to IO circuits that bring data into and out of the computing core, a power delivery circuit to deliver power to the computing core and aggregated or disaggregated memory banks that function as cache for the computing core. A plurality of such cores may be referred to as a core complex, although they may also be simply called cores. As computing cores typically require additional components to create a fully functional chip or a SOC, these complementary components are assumed to be inherent, either coupled directly to the cores in question or by way of other cores or circuit blocks (e.g., portions, i.e., "blocks" of circuits), in the microelectronic assembly of the various embodiments disclosed herein.

On the electrical and logic protocol side, this is accommodated through standardizing the die-to-die interfaces to accommodate connecting different dies together. In some scenarios, e.g., when moving core or IO dies to different process nodes or different manufacturers, the die sizes end up becoming a bit larger or smaller. This can generally be accommodated in standard organic packages where the die-to-die routing density is not very high and having matching die edge sizes is not a major requirement. However, this is very challenging to accommodate in 3D ICs with fixed (e.g., silicon) interposer or EMIB sizes/widths and tight channel specifications.

Embodiments of the present disclosure provide a microelectronic assembly comprising: a first plurality IC dies arranged in an array of rows and columns in a first layer and a second plurality of IC dies in a second layer not coplanar with the first layer. In some embodiments, a first IC die in the first plurality is larger than surrounding IC dies in the first plurality, and a second IC die in the second plurality coupled to the first IC die is at least one of longer and wider than adjacent IC dies in the second plurality. In some embodiments, a first IC die in the first plurality is smaller than surrounding IC dies in the first plurality, and a second IC die in the second plurality coupled to the first IC die comprises fanout structures. The microelectronic assembly may further comprise a redistribution layer between the second layer and a third layer comprising a package substrate in some embodiments. In some embodiments, a first IC die in the first plurality has an incompatible interface for communication with adjacent IC dies in the first plurality, and a second IC die in the second plurality coupled to the first IC die comprises a circuit for protocol translation that enables the first IC die to communicate with the adjacent IC dies in the first plurality.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of IO (I/O) functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

In context of a stack of dies coupled to one another or in context of a die coupled to a package substate, the term "interconnect" may also refer to, respectively, die-to-die (DTD) interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 7 microns and 100 microns. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photo-imageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple subelements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a simplified top view of a microelectronic assembly 100 according to some embodiments of the present disclosure. Microelectronic assembly 100 comprises a plurality IC dies 102 in a first layer 104; a plurality of bridge dies 106 in a second layer 108; and a package substrate 110 in a third layer 112. First layer 104, second layer 108, and third layer 112 are not coplanar as shown in FIG. 2B, for example. In various embodiments, at least some IC dies 102 may comprise a core complex of a microprocessor and at least some other IC dies 102 may comprise IO (I/O) interfaces. In some embodiments, one or more IC die 102 may comprise a stack of IC dies (e.g., high-bandwidth memory, logic on logic, or logic on memory); in other embodiments, IC dies 102 may comprise monolithic dies.

In some embodiments, package substrate 110 may comprise an organic substrate; in other embodiments, package substrate 110 may comprise an inorganic interposer (e.g., made of glass, ceramic or semiconductor materials). In some embodiments, package substrate 110 may comprise multiple layers of conductive traces embedded in one or more layers of organic dielectric. For example, package substrate 110 may comprise a laminate substrate with several layers of metal planes or traces that are interconnected to each other by through-hole plated vias, with IO routing planes on the top and bottom layers, while the inner layers are used as a ground and power plane. In yet other embodiments, package substrate 110 may comprise a composite of organic and inorganic materials, for example, with an embedded semiconductor die in an organic substrate. In some embodiments, package substrate 110 may comprise an inorganic interposer with active circuits therein; in other embodiments, package substrate 110 may comprise an inorganic interposer with no active circuits therein.

In the example embodiment shown, second layer 108 comprising the plurality of bridge dies 106 is between first layer 104 and third layer 112. In various embodiments, bridge die 106 comprises a relatively small piece of IC die (e.g., smaller than IC die 102) located under edges of two adjacent IC dies 102 and providing electrical coupling at silicon-level interconnect density between the interconnected IC dies 102. In some embodiments, bridge dies 106 may be under IC dies 102 (as shown); in some other embodiments, bridge dies 106 may be over IC dies 102; in yet other embodiments, some bridge dies 106 may be under some IC dies 102 and other bridge dies 106 may be over other IC dies 102.

The plurality of IC dies 102 may be arranged in an array of rows and columns in a tiled compute architecture. Such a tiled compute architecture allows adding more core complex dies or replacing the peripheral I/O dies for enabling customizable products. On the electrical and logic protocol side, the customization is accommodated through standardizing die-to-die interfaces to accommodate connecting different dies together. In some scenarios, for example, when moving core or I/O dies to different process nodes or different manufacturers, one (or more) of IC dies 102 may be replaced with another die that offers a different functionality or is made by a different manufacturer than the rest. For example, a space 114 represents a missing IC die in the array of the first plurality of IC dies 102.

As shown in FIG. 2A, in some embodiments, space 114 may be filled by an IC die 202 offering the desired functionality or made by a different manufacturer. However, IC die 202 may be of a different size than adjacent IC dies 102. In the example shown, IC die 202 is larger than adjacent IC dies 102. In traditional organic packages, where the die-to-die routing density is not very high and having matching die edge sizes is not a major requirement, such die size variation can be accommodated with minimal cost impact. However, such different die sizes in a modular tiled architecture becomes very challenging to accommodate in three-dimensional (3D) integrated circuits with fixed interposer or EMIB sizes, widths, and tight channel specifications. A new package may have to be designed to accommodate the differently sized die, defeating the purpose of the modular tiled architecture.

According to various embodiments, the differently sized IC die 202 may be accommodated by a corresponding change in one or more of bridge dies 106. For example, a bridge die 204 in the plurality of bridge dies 106 may be coupled to IC die 202 in layer 108. Bridge die 204 may be wider and/or longer than adjacent bridge dies 106 in the second plurality. Such an arrangement may enable agile microprocessor design, allowing responding to market demand without a full package tapeout. The arrangement may also enable quick development and testing of new IC dies using older platforms without being limited to the same size as the older IC dies.

If sufficient margins exist (i.e., IC die 202 is not significantly larger than adjacent IC dies 102), bridge die 204 may be passive in some embodiments, for example, like other bridge dies 106 in the plurality of bridge dies in layer 108. However, typical die-to-die connections have relatively tight specifications to achieve high energy efficiency. In such cases, some embodiments of bridge die 204 may comprise active devices in the form of repeater circuitry 206 in the electrical pathways used to connect IC die 202 with adjacent IC dies 102. In various embodiments, repeater circuitry 206 amplifies electrical signals, and may also retime, resynchronize, and reshape pulses comprising the electrical signals. In some embodiments, repeater circuitry 206 may comprise linear amplifiers and electronic filters, comprising active devices. In some embodiments, repeater circuitry 206 may be provided after every fixed length of the electrical pathway to reproduce the original electrical signal. Repeater circuitry 206 may comprise any type of repeater circuit known in the art.

A cross-sectional view of microelectronic assembly 100 of FIG. 2A along axis BB' is shown in FIG. 2B. In the example embodiment shown, the plurality of bridge dies 106 is embedded in a dielectric 208 in second layer 108. In some embodiments, dielectric 208 may comprise organic materials (e.g., mold compound). In other embodiments, dielectric 208 may comprise inorganic materials (e.g., silicon oxide, silicon nitride, silicon oxynitride, etc.) Through-dielectric vias (TDVs) 210 in dielectric 208 provide electrical coupling between IC dies (e.g., 102, 202) in first layer 104 and package substrate 110 in third layer 112. Although not explicitly shown in the figure, bridge dies (e.g., 106, 204) may comprise TSVs that also facilitate coupling between IC dies (e.g., 102, 202) in first layer 104 and package substrate 110 in third layer 112.

Figure 3A:
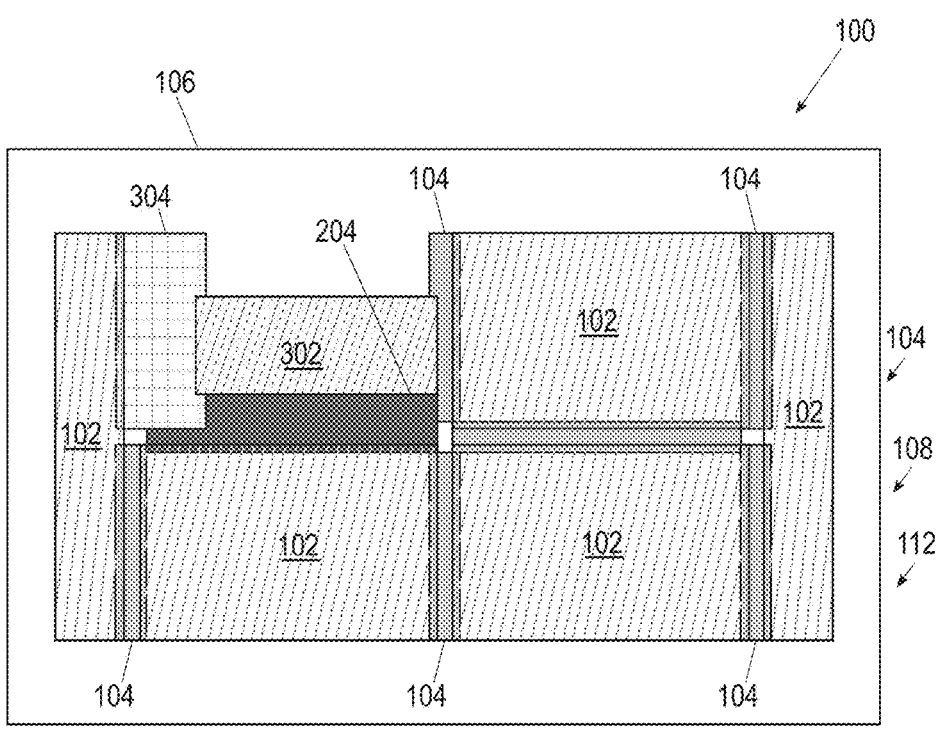
FIG. 3A is a simplified top view of yet another example microelectronic assembly, according to various embodiments of the present disclosure.

As shown in FIG. 3A, in some embodiments, space 114 may be filled with an IC die 302 offering the desired functionality or made by a different manufacturer that may be smaller than adjacent IC dies 102. According to various embodiments, the differently sized IC die 302 may be accommodated by a corresponding change in one or more of bridge dies 106. For example, bridge die 204 in the plurality of bridge dies 106 may be coupled to IC die 302. Bridge die 204 may be wider and/or longer than adjacent bridge dies 106 in the second plurality. Another bridge die 304 may also be coupled to IC die 302. Bridge die 304 may comprise fanout structures to accommodate the shorter available shoreline on IC die 302. Such an arrangement may enable agile microprocessor design, allowing responding to market demand without a full package tapeout. The arrangement may also enable quick development and testing of new IC dies using older platforms without being limited to the same size as the older IC dies.

Figures 3B, 3C:
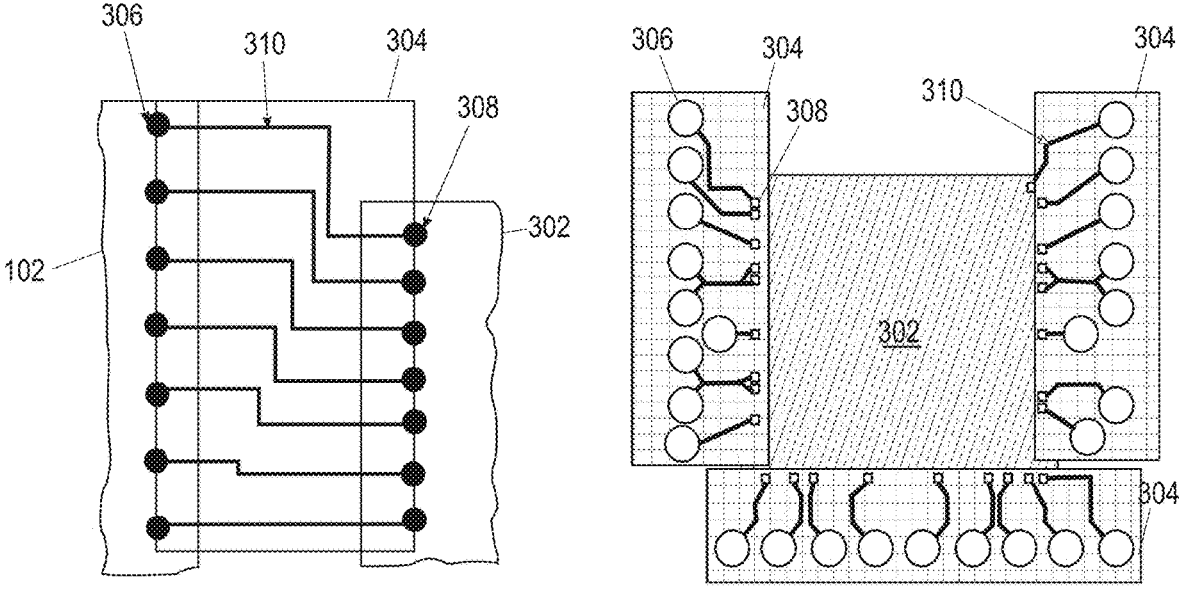
FIGS. 3B-3C are schematic block diagrams of details associated with the example microelectronic assembly of FIG. 3A.

FIG. 3B shows a portion of bridge die 304 in greater detail. Bridge die 304 couples larger IC die 102 on one side with smaller IC die 302 on an opposite side. Interconnects 306 on longer IC die 102 may be electrically coupled to interconnects 308 on smaller IC die 302 through fanout structures 310 in bridge die 304. Interconnects 308 may be spaced wider apart than interconnects 306, for example, because of the longer shoreline (e.g., edge) of IC die 102 compared to smaller IC die 302. Fanout structures 310 may comprise a particular form of routing in some embodiments, for example, coupling interconnects 306 and 308. In various embodiments, fanout structures 310 result in longer electrical pathways than in other bridge dies 106 that couple IC dies of similar sizes.

In a general sense, fanout refers to widening the pitch between two circuits or dies. Thus, as shown in FIG. 3C, interconnects 308 on smaller IC die 302 may comprise the same number of interconnects as interconnects 306 on IC die 102 but may have a smaller pitch than interconnects 306. Fanout structures 310 in bridge die 304 may thus facilitate routing between interconnects 306 having a first pitch and interconnects 308 having a second pitch, the first pitch being smaller than the second pitch. In some embodiments, IC die 302 may be coupled to more than one bridge die 304 with fanout structures 310. Fanout structures 310 may be different in each bridge die 304 depending on the respective IC dies 102 coupled thereto. Such fanout structures 310 of bridge die 304 may also require some redesign on package substrate 110 in some embodiments. However, compared to more complex redesign, and/or other measures to accommodate the smaller size of IC die 302, fanout may be an acceptable compromise in terms of lower cost at the expense of performance in some embodiments.

In some embodiments, smaller IC die 302 may necessitate use of bridge die 204 in layer 108, for example on a side of smaller IC die 302 that is orthogonal to another side proximate to bridge die 304. As described in reference to FIGS. 2A-2B, bridge die 204 is longer and/or wider than surrounding bridge dies 106. Bridge die 204 comprises least one repeater circuitry 206 in an electrical pathway therethrough coupling smaller IC die 302 with adjacent larger IC die 102.

Figure 4A:
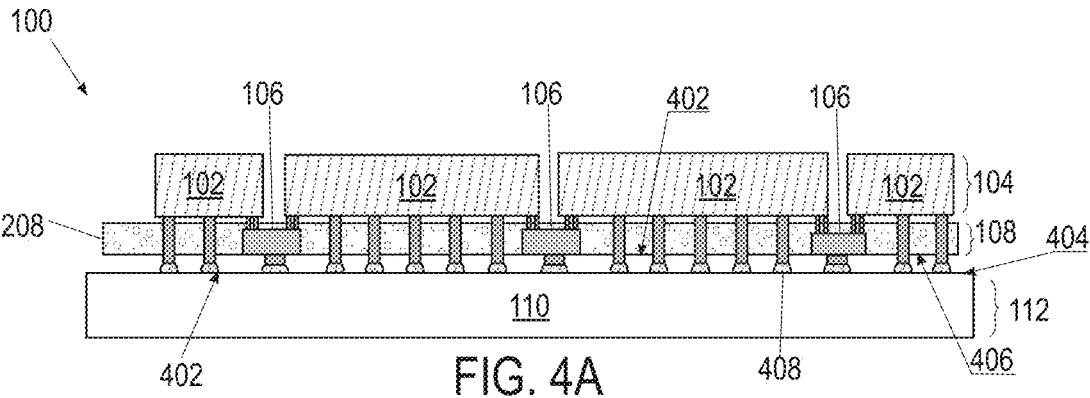
FIGS. 4A-4C are simplified cross-sectional views of example microelectronic assemblies, according to various embodiments.

FIG. 4A is a simplified cross-sectional view of the example microelectronic assembly 100 of FIG. 1. The example embodiment illustrates uniformly sized IC dies 102 electrically coupled with bridge dies 106 embedded in dielectric 208. A routing pattern 402 comprising interconnect pads on side 404 of layer 112 may correspond to a mating pattern 402 on a proximate, parallel side 406 of layer 108. In an assembled configuration, the pads of routing pattern 402 on sides 404 and 406 are coupled by suitable DTPS interconnects 408, for example, solder balls.

Figure 4B:
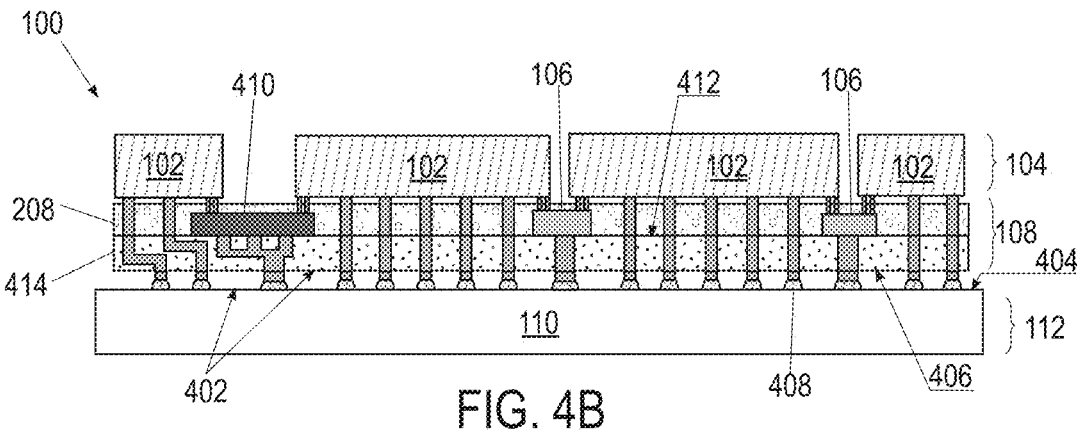

FIG. 4B is a simplified cross-sectional view of example microelectronic assembly 100 having a bridge die 410 to accommodate a differently sized IC die in layer 104 (e.g., 202, 302). Bridge die 410 may comprise repeater circuitry 206 as in bridge die 204 or fanout structure 310 as in bridge die 304 depending on whether the differently sized die in layer 104 is larger (e.g., IC die 202) or smaller (e.g., IC die 302), respectively. Adding the differently sized die in layer 104 and bridge die 410 in layer 108 may result in routing pattern 412 that is different from routing pattern 402, for example, because some IC dies 202 may be moved from their original positions to accommodate the differently sized die, or bridge die 410 has underlying connection pads different from other bridge dies 106, etc. According to the example embodiment shown, changed routing pattern 412 may be adapted to routing pattern 402 on package substrate 110 by a suitable redistribution layer (RDL) 414 in layer 108 such that routing pattern on side 406 of layer 108 corresponds to routing pattern 402. RDL 414 comprises one or more layers of conductive pathways in dielectric material. The selection of the dielectric material for RDL 414 and the number of layers in RDL 414 may depend on the mechanical and electrical characteristics of microelectronic assembly 100 and/or IC dies therein (e.g., 102, 106, 202, 410). In an assembled configuration, the pads of routing pattern 402 on sides 404 and 406 are coupled by suitable DTPS interconnects 408, for example, solder balls. RDL 414 permits use of existing package substrate 110 without any modifications thereto to accommodate the differently sized IC die in layer 104.

Figure 4C:
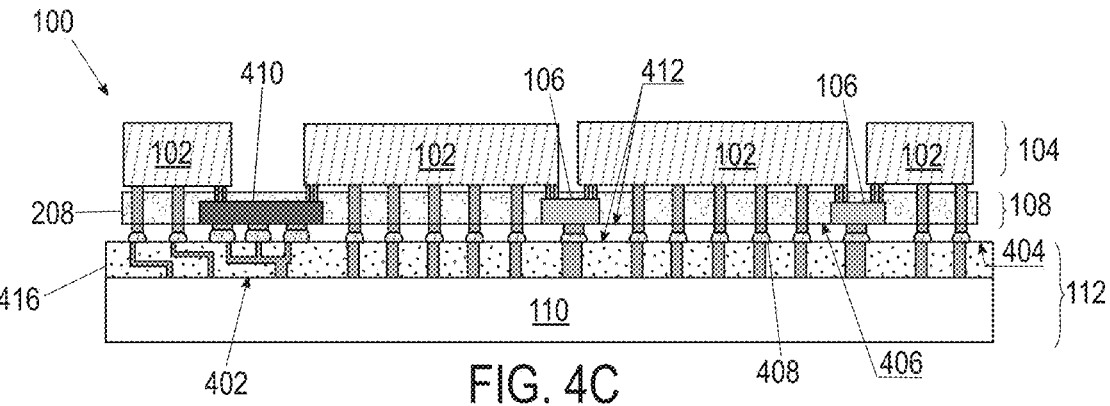

FIG. 4C is a simplified cross-sectional view of another example microelectronic assembly 100 having a bridge die 410 to accommodate a differently sized IC die in layer 104 (e.g., 202, 302). Bridge die 410 may comprise repeater circuitry 206 as in bridge die 204 or fanout structure 310 as in bridge die 304 depending on whether the differently sized die in layer 104 is larger (e.g., IC die 202) or smaller (e.g., IC die 302), respectively. Adding the differently sized die in layer 104 and bridge die 410 in layer 108 may result in routing pattern 412 that is different from routing pattern 402, for example, because some IC dies 202 may be moved from their original positions to accommodate the differently sized die, or bridge die 410 has underlying connection pads different from other bridge dies 106, etc. According to the example embodiment shown, the changed routing pattern may be adapted to routing pattern 402 on package substrate 110 by a suitable RDL 416 in layer 112 over package substrate 110 such that routing pattern on side 404 of layer 108 corresponds to routing pattern 412. In an assembled configuration, the pads of routing pattern 412 on sides 404 and 406 are coupled by suitable DTPS interconnects 408, for example, solder balls. RDL 416 comprises one or more layers of conductive pathways in dielectric material. The selection of the dielectric material for RDL 416 and the number of layers in RDL 416 may depend on the mechanical and electrical characteristics of microelectronic assembly 100 and/or IC dies therein (e.g., 102, 106, 202, 410).

Figure 5:
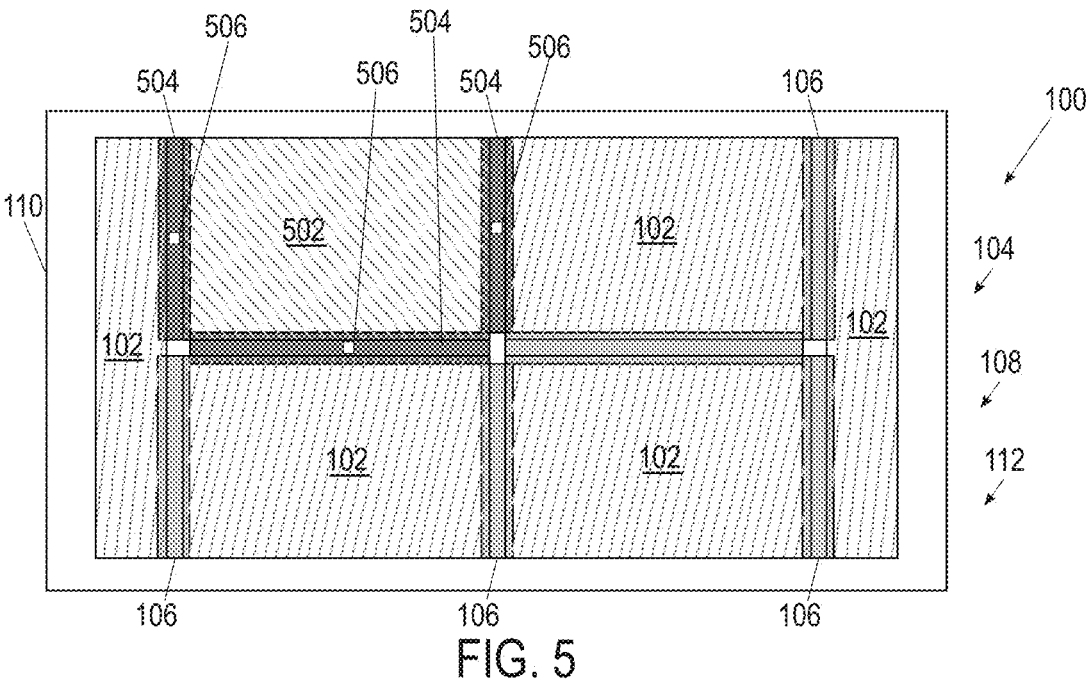
FIG. 5 is a simplified top view of yet another example microelectronic assembly, according to various embodiments of the present disclosure.

FIG. 5 is a simplified top view of a microelectronic assembly 100 according to some embodiments of the present disclosure. In the example embodiment shown, an IC die 502 among the plurality of IC dies in layer 104 is similarly sized as IC dies 102 but does not have a compatible interface for communication with adjacent IC dies 102. A "communication interface," as used herein, comprises an electronic circuit, along with associated communication protocols usually designed to a specific standard, that enables one to IC die to communicate with another IC die. Examples of communication interface include die-to-die (D2D) interface, parallel physical layer (PHY), Serializer/Deserializer (SerDes) PHY, High-Definition Multimedia Interface (HDMI), Double Data Rate 3 (DDR3), etc. Bridge dies 504 may be used to electrically couple IC die 502 in such embodiments. Bridge dies 504 comprise circuit block 506 comprising complex active circuitry for protocol translation between IC die 502 and adjacent IC dies 102.

The particular form of circuit block 506 depends on the specific protocol translation needed for IC die 502, i.e., the different communication interface being used in IC die 502 as opposed to IC dies 102. For example, IC die 502 may comprise a first interface for communication, and IC die 102 may comprise a second interface for communication that is incompatible with the first interface, such that IC die 502 cannot communicate with adjacent IC die 102. Bridge die 504 comprises circuit block 506 for protocol translation between the first interface and the second interface, such that IC die 502 is enabled to communicate with adjacent IC die 102 through circuit block 506. With this architecture, the rest of microelectronic assembly 100 remains unchanged, enabling a modular tiled compute architecture with minimal design impact on surrounding circuitry. In embodiments where IC die 502 is also differently sized, any one of the approaches described in relation to the preceding figures, such as using repeater circuitry 206, or fanout structures 310 or RDLs 414, 416 may be implemented together with circuit block 506 in bridge dies 504 suitably.

Figure 6:
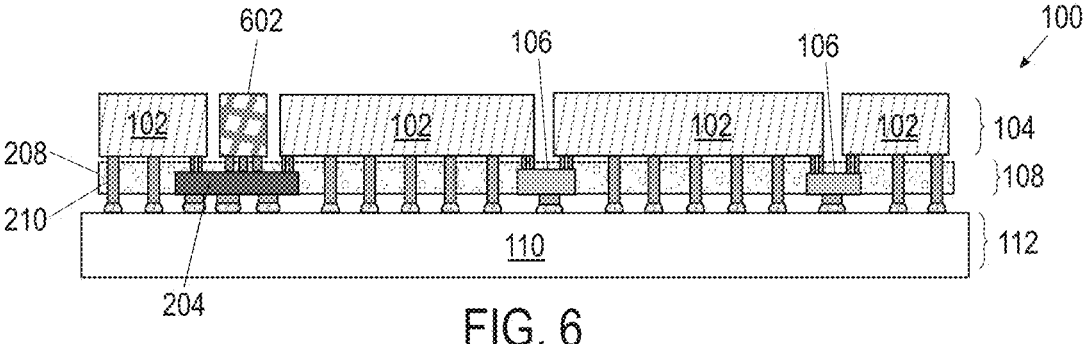
FIG. 6 is a simplified cross-sectional view of yet another example microelectronic assembly, according to various embodiments of the present disclosure.

FIG. 6 is a simplified cross-sectional view of yet another example microelectronic assembly, according to various embodiments of the present disclosure. The microelectronic assembly 100 of FIG. 6 is similar to that of FIGS. 2A and 2B in that although not shown, one of IC dies 102 (e.g., IC die 202) in first layer 104 is larger than the surrounding IC dies, and hence, one of bridge dies 106 (e.g., bridge die 204) is longer and/or wider than adjacent bridge dies 106. The consequent gap over bridge die 106 may not be desirable from thermal and/or mechanical reliability considerations, for example, because of the nonuniform distribution of silicon in first layer 104 resulting from the gap. In such cases, a dummy IC die 602 that does not comprise any functional electrical circuits, active circuitry, or any circuitry, may be coupled to bridge die 204. The coupling may be purely mechanical, with no electrical pathways through IC die 602 in some embodiments. In some embodiments, IC die 602 may comprise a piece of bulk silicon; in other embodiments, IC die 602 may comprise inactive circuitry, for example, a bad die having non-functional circuits. Any suitable type of silicon material that provides the desired material/volumetric balance in layer 104 may be used as dummy IC die 602 within the broad scope of the embodiments.

In various embodiments, any of the features discussed with reference to any of FIGS. 1-6 herein may be combined with any other features to form a package with one or more ICs as described herein, for example, to form a modified microelectronic assembly 100. Some such combinations are described above, but, in various embodiments, further combinations and modifications are possible.

Example Devices and Components

Figure 7:
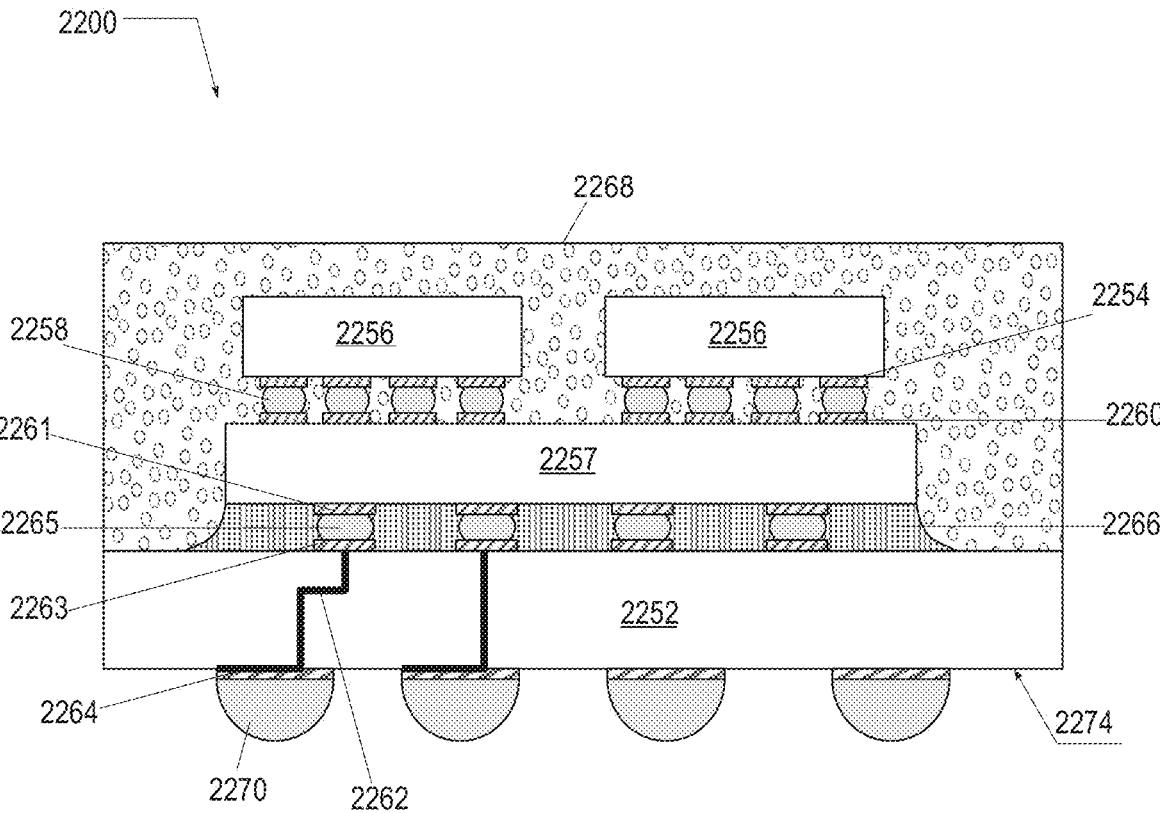
FIG. 7 is a cross-sectional view of a device package that includes one or more microelectronic assemblies in accordance with any of the embodiments disclosed herein.
Figure 8:
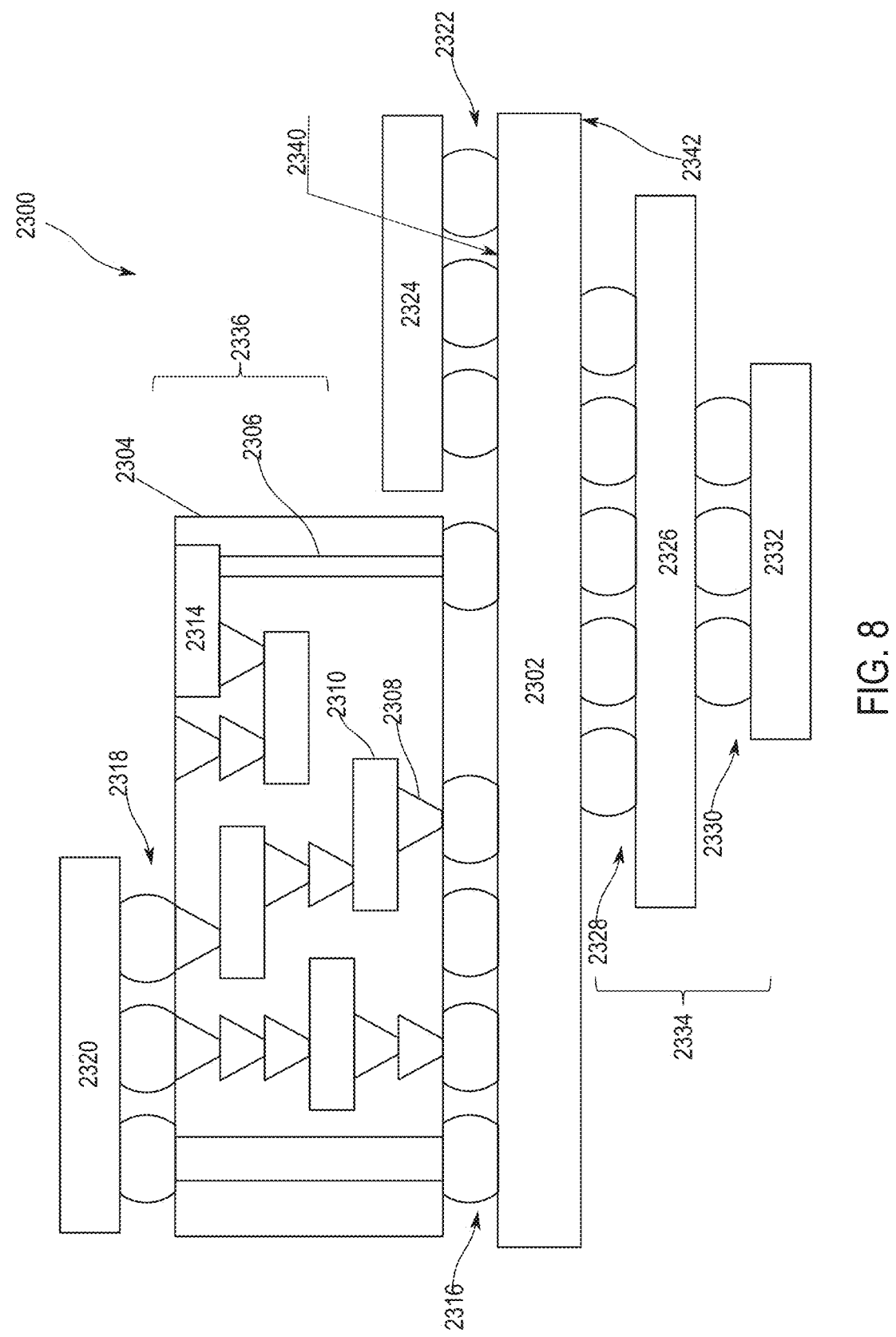
FIG. 8 is a cross-sectional side view of a device assembly that includes one or more microelectronic assemblies in accordance with any of the embodiments disclosed herein.
Figure 9:
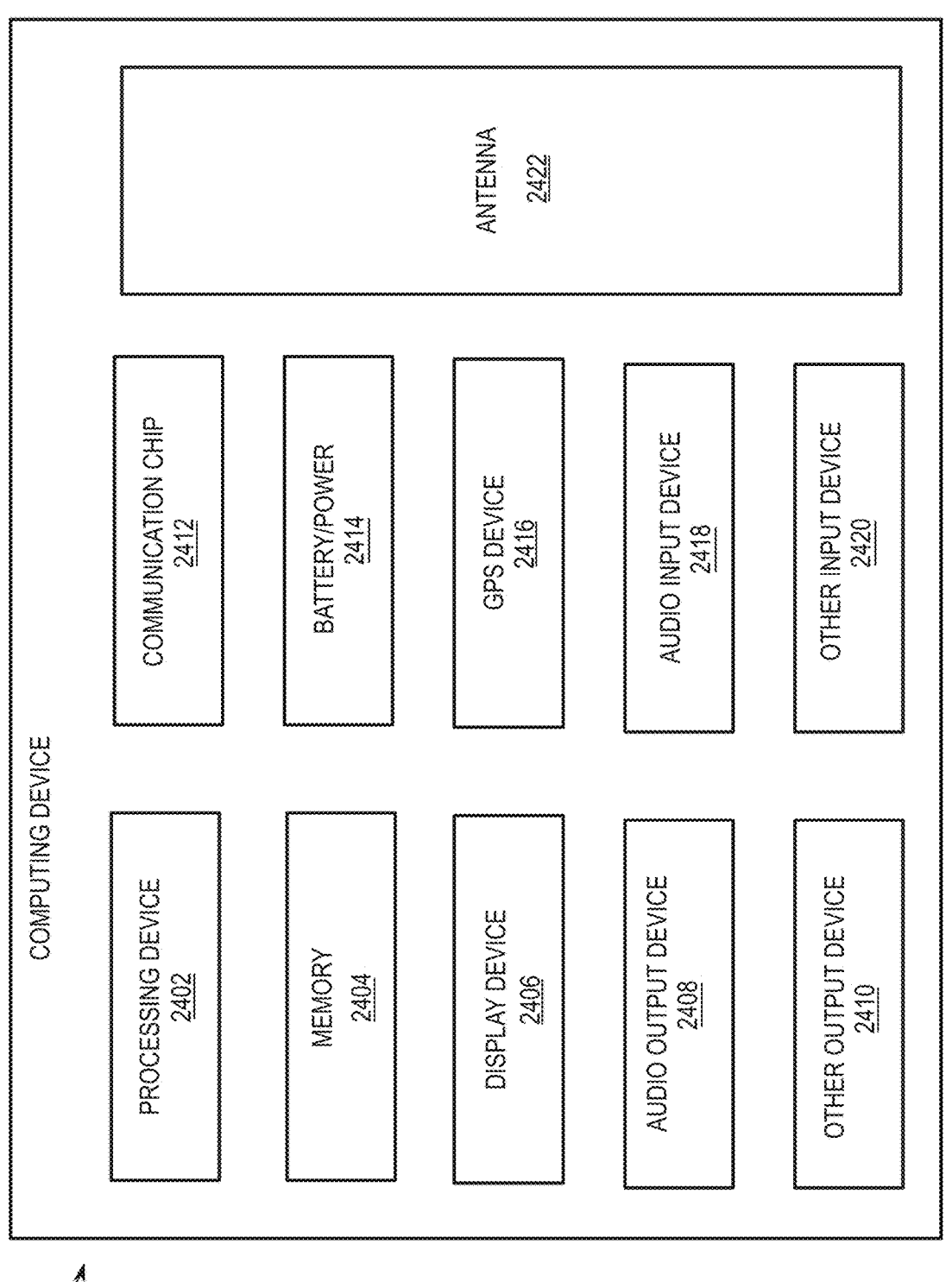
FIG. 9 is a block diagram of an example computing device that includes one or more microelectronic assemblies in accordance with any of the embodiments disclosed herein.

The packages disclosed herein, e.g., any of the embodiments shown in FIGS. 1-6 or any further embodiments described herein, may be included in any suitable electronic component. FIGS. 7-9 illustrate various examples of packages, assemblies, and devices that may be used with or include any of the IC packages as disclosed herein.

FIG. 7 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level inter-connects 2258 may be used, such as solder bumps, solder posts, or bond wires. As used herein, a "conductive contact" may refer to a portion of electrically conductive material (e.g., metal) serving as an interface between different com-ponents; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodi-ments, underfill material 2266 may be the same as mold 2268. Example materials that may be used for underfill material 2266 and mold 2268 are epoxies as suitable. Second-level interconnects 2270 may be coupled to conduc-tive contacts 2264. Second-level interconnects 2270 illus-trated in the figure are solder balls (e.g., for a ball grid array (BGA) arrangement), but any suitable second-level inter-connects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 8.

In various embodiments, any of dies 2256 may be micro-electronic assembly 100 as described herein. In embodi-ments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) pack-age. In another example, IC package 2200 may be a wafer-level chip scale package (WLCSP) or a panel fanout (FO) package. Although two dies 2256 are illustrated in IC package 2200, IC package 2200 may include any desired number of dies 2256. IC package 2200 may include addi-tional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 8 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more micro-electronic assembly 100 in accordance with any of the embodiments disclosed herein; e.g., any of the IC packages discussed below with reference to IC device assembly 2300 may take the form of any of the embodiments of IC package 2200 discussed above with reference to FIG. 7.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB pack-age substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling com-ponents 2318. Coupling components 2318 may take any suitable form depending on desired functionalities, such as the forms discussed above with reference to coupling com-ponents 2316. In some embodiments, IC package 2320 may be or include IC package 2200, e.g., as described above with reference to FIG. 7. In some embodiments, IC package 2320 may include at least one microelectronic assembly 100 as described herein. Microelectronic assembly 100 is not spe-cifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connec-tion to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 9 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 7). In yet another example, any one or more of the components of computing device 2400 may include an IC device assembly 2300 (e.g., as shown in FIG. 8).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100, FIGS. 2A-2B) comprising: a first plurality IC dies (e.g., 102) arranged in an array of rows and columns in a first layer (e.g., 104); and a second plurality of IC dies (e.g., 106) in a second layer (e.g., 108) not coplanar with the first layer, where a first IC die (e.g., 202) in the first plurality is larger than surrounding IC dies in the first plurality, and a second IC die (e.g., 204) in the second plurality coupled to the first IC die is at least one of longer and wider than adjacent IC dies in the second plurality.

Example 2 provides the microelectronic assembly of example 1, in which the second IC die comprises at least one repeater circuitry (e.g., 206) having an active device in an electrical pathway coupling the first IC die with an adjacent IC die in the first plurality.

Example 3 provides the microelectronic assembly of example 2, in which other IC dies in the second plurality do not contain any active devices.

Example 4 provides the microelectronic assembly of any of examples 1-3, in which the first IC die comprises a stack of IC dies.

Example 5 provides the microelectronic assembly of any of examples 1-4, in which: the second plurality of IC dies is embedded in a dielectric (e.g., 208) in the second layer, and TDVs (e.g., 210) in the second layer provide electrical coupling between the first layer and the third layer.

Example 6 provides the microelectronic assembly of any of examples 1-5, in which IC dies in the second plurality electrically couple adjacent IC dies in the first plurality.

Example 7 provides the microelectronic assembly of any of examples 1-6, further comprising a package substrate.

Example 8 provides the microelectronic assembly of example 7, in which the package substrate comprises a silicon interposer.

Example 9 provides the microelectronic assembly of any of examples 1-8, further comprising a third IC die (e.g., 602, FIG. 6) in the first layer coupled mechanically to the second IC die, in which the third IC die does not comprise any functional electrical circuits.

Example 10 provides an IC package comprising: a first IC die (e.g., 102) in a first layer (e.g., 104); a second IC die (e.g., 106) in a second layer (e.g., 108) between the first layer and a third layer (e.g., 112); and a package substrate (e.g., 110) in the third layer. The first IC die is part of an array of smaller sized IC dies in the first layer, the second IC die (e.g., 204) comprises repeater circuitry (e.g., 206) in an electrical pathway coupling the first IC die with an adjacent IC die in the array.

Example 11 provides the IC package of example 10, in which the second IC die is part of another array of smaller sized bridge dies.

Example 12 provides the IC package of any of examples 10-11, in which the smaller sized bridge dies do not comprise any active devices.

Example 13 provides the IC package of any of examples 10-12, in which the second layer comprises a dielectric surrounding the second IC die.

Example 14 provides the IC package of example 13, further comprising TDVs in the dielectric.

Example 15 provides the IC package of any of examples 10-14, in which: the first IC die comprises a core complex, and the second IC die comprises a bridge die.

Example 16 provides the IC package of any of examples 10-15, in which another IC die in the first layer comprises an I/O die.

Example 17 provides a server architecture comprising: an array of core complexes (e.g., 102) in a first layer (e.g., 104), electrically coupled along edges of individual core complexes by bridge dies (e.g., 106) in a second layer (e.g., 108) not coplanar with the first layer, in which: the array forms a modular tiled compute architecture, at least one core complex is not similarly sized as other core complexes in the array, and at least one bridge die electrically coupling the at least one core complex is at least one of wider and longer than other bridge dies.

Example 18 provides the server architecture of example 17, in which the at least one bridge die comprises repeater circuitry (e.g., 206) in an electrical pathway coupling the at least one core complex with an adjacent core complex in the array.

Example 19 provides the server architecture of any of examples 17-18, in which the bridge dies are surrounded by a dielectric.

Example 20 provides the server architecture of example 19, further comprising TDVs in the dielectric.

Example 21 provides a microelectronic assembly (e.g., 100, FIGS. 3A-3C) comprising: a first plurality IC dies arranged in an array of rows and columns in a first layer (e.g., 104); and a second plurality of IC dies in a second layer (e.g., 108) not coplanar with the first layer. A first IC die (e.g., 302) in the first plurality is smaller than surrounding IC dies in the first plurality, a second IC die (e.g., 304) in the second plurality coupled to the first IC die comprises fanout structures (e.g., 310).

Example 22 provides the microelectronic assembly of example 21, in which (e.g., FIG. 3B): the second IC die in the second layer couples the first IC die in the first layer and an adjacent IC die in the first layer, first interconnects (e.g., 308) between the second IC die and the adjacent IC die are spaced wider apart than second interconnects (e.g., 306) between the second IC die and the first IC die, and the fanout structures are between the first interconnects and the second interconnects.

Example 23 provides the microelectronic assembly of example 22, in which (e.g., FIG. 3C): the first interconnects comprise a first number of interconnects with a first pitch, the second interconnects comprise a second number of interconnects with a second pitch, the first number is equal to the second number, the first pitch is larger than the second pitch, and the fanout structures comprise electrical routing between the first interconnects and the second interconnects.

Example 24 provides the microelectronic assembly of any of examples 21-22, further comprising a third IC die (e.g., 204) in the second plurality, in which: the third IC die couples the first IC die with another adjacent IC die, the third IC die is at least one of longer and wider than surrounding IC dies in the second plurality, and the third IC die comprises at least one repeater circuitry in an electrical pathway through the third IC die coupling the first IC die with another adjacent IC die.

Example 25 provides the microelectronic assembly of any of examples 21-22, in which IC dies in the second plurality electrically couple adjacent IC dies in the first plurality.

Example 26 provides the microelectronic assembly of any of examples 21-22, further comprising a package substrate in a third layer, in which the second layer is between the first layer and the third layer.

Example 27 provides the microelectronic assembly of example 26, in which the package substrate comprises a silicon interposer.

Example 28 provides the microelectronic assembly of example 26, in which the package substrate comprises an organic substrate.

Example 29 provides the microelectronic assembly of any of examples 21-28, further comprising other IC dies in the first layer that are not part of the first plurality.

Example 30 provides the microelectronic assembly of any of examples 21-29, in which the second layer comprises a dielectric with TDVs electrically coupled to the first layer.

Example 31 provides an IC package comprising: a first IC die (e.g., 302) in a first layer (e.g., 104); a second IC die (e.g., 304) in a second layer (e.g., 108) between the first layer and a third layer (e.g., 112); and a package substrate (e.g., 106) in the third layer, in which: the first IC die is part of an array of larger IC dies (e.g., 102) in the first layer, the second IC die couples the first IC die and an adjacent larger IC die (e.g., 102), and the second IC die comprises fanout structures (e.g., 310) between the first IC die and the adjacent larger IC die.

Example 32 provides the IC package of example 31, in which: a first set of interconnects coupling the second IC die to the first IC die comprises a first number of interconnects with a first pitch, a second set of interconnects coupling the second IC die to the adjacent larger IC die comprises a second number of interconnects with a second pitch, the first number is equal to the second number, the first pitch is smaller than the second pitch, and the fanout structures comprise electrical routing between the first set of interconnects and the second set of interconnects.

Example 33 provides the IC package of any of examples 31-32, in which the second layer comprises a dielectric with TDVs electrically coupling the first layer and the third layer.

Example 34 provides the IC package of any of examples 31-33, in which the package substrate comprises one of an organic substrate and a silicon interposer.

Example 35 provides a microelectronic assembly (e.g., 100, FIGS. 4A-4C) comprising: a first plurality IC dies arranged in an array of rows and columns in a first layer; a second plurality of IC dies in a second layer between the first layer and a third layer; and a package substrate in the third layer, in which: a first IC die in the first plurality has a different footprint than surrounding IC dies in the first plurality, and a redistribution layer (RDL) between the second layer and the third layer accommodates electrical routing for the different footprint.

Example 36 provides the microelectronic assembly of example 35, in which the RDL is on the package substrate proximate to the second layer.

Example 37 provides the microelectronic assembly of example 35, in which the RDL is on the second layer proximate to the package substrate.

Example 38 provides the microelectronic assembly of example 37, in which the package substrate is interchangeable with another package substrate of another microelectronic assembly in which the first IC die does not have the different footprint.

Example 39 provides the microelectronic assembly of any of examples 35-38, in which: the second plurality of IC dies is embedded in a dielectric in the second layer, and TDVs in the second layer provide electrical coupling between the first layer and the third layer.

Example 40 provides the microelectronic assembly of any of examples 35-39, in which IC dies in the second plurality electrically couple adjacent IC dies in the first plurality.

Example 41 provides the microelectronic assembly of any of example 35-40, in which the package substrate comprises a silicon interposer.

Example 42 provides an IC package comprising: a first IC die in a first layer; a second IC die in a second layer between the first layer and a third layer; and a package substrate in the third layer, in which: the first IC die is part of an array of IC dies in the first layer of the IC package, the second IC die electrically couples the first IC die and an adjacent IC die; the first IC die has a different footprint than surrounding IC dies in the array, and a RDL between the second layer and the third layer accommodates electrical routing for the different footprint.

Example 43 provides the IC package of example 42, in which the RDL layer is on the package substrate on a side proximate to the second layer.

Example 44 provides the IC package of example 42, in which the RDL layer is on the second layer on a side proximate to the package substrate.

Example 45 provides a microelectronic assembly (e.g., 100, FIG. 5) comprising: a first plurality IC dies arranged in an array of rows and columns in a first layer; a second plurality of IC dies in a second layer between the first layer and a third layer; and a package substrate in the third layer, in which: a first IC die (e.g., 502) in the first plurality has an incompatible interface for communication with adjacent IC dies in the first plurality, a second IC die (e.g., 504) in the second plurality coupled to the first IC die comprises a circuit (e.g., 506) for protocol translation that enables the first IC die to communicate with the adjacent IC dies in the first plurality.

Example 46 provides the microelectronic assembly of example 45, in which: the first IC die is larger than the adjacent IC dies in the first plurality, and the second IC die further comprises a repeater circuit to facilitate electrical coupling with the first IC die.

Example 47 provides the microelectronic assembly of example 45, in which: the first IC die is smaller than the adjacent IC dies in the first plurality, and the second IC die further comprises a fanout structure to facilitate electrical coupling with the first IC die.

Example 48 provides the microelectronic assembly of example 45, in which: the first IC die is differently sized than the adjacent IC dies in the first plurality, and the microelectronic assembly further comprises a RDL between the second layer and the third layer.

Example 49 provides the microelectronic assembly of example 48, in which the RDL is on one of: the package substrate and the second layer.

Example 50 provides the microelectronic assembly of any of examples 45-49, in which the package substrate comprises one of a silicon interposer and an organic substrate.

Example 51 provides a microelectronic assembly comprising: a first plurality of IC dies arranged in an array of rows and columns in a first layer; and a second plurality of IC dies in a second layer not coplanar with the first layer, in which a first IC die in the first plurality is differently sized than surrounding IC dies in the first plurality, and a second IC die in the second plurality coupled to the first IC die comprises at least one of: a repeater circuitry and a fanout structure in an electrical pathway coupling the first IC die with an adjacent IC die in the first plurality.

Example 52 provides the microelectronic assembly of example 51, where the first IC die is larger than surrounding IC dies, and the second IC die is at least one of longer and wider than adjacent IC dies in the second plurality.

Example 53 provides the microelectronic assembly of example 51, where the first IC die is smaller than surrounding IC dies, and the second IC die comprises the fanout structures but not the repeater circuitry.

Example 54 provides the microelectronic assembly of any of examples 51-53, where the second plurality of IC dies is embedded in a dielectric in the second layer, and TDVs in the second layer provide electrical coupling between the first layer and a third layer.

Example 55 provides the microelectronic assembly of example 51, further comprising a RDL between the second layer and a package substrate.

Example 56 provides the microelectronic assembly of any of examples 51-55, further comprising a third IC die in the first layer coupled mechanically to the second IC die, where the third IC die does not comprise any functional electrical circuits.

Example 57 provides the microelectronic assembly of any of examples 51-56, where a third IC die in the first plurality of IC dies has an incompatible communication interface with adjacent IC dies in the first plurality, and a fourth IC die in the second plurality of IC dies comprises a circuit for protocol translation that enables the third IC die to communicate with the adjacent IC dies.

Example 58 provides the microelectronic assembly of any of examples 51-56, further comprising other IC dies in the first layer that are not part of the first plurality.

Example 59 provides an IC package comprising: a first IC die in a first layer; a second IC die in a second layer between the first layer and a third layer; and a package substrate in the third layer. The first IC die is part of an array of uniformly sized IC dies in the first layer, the first IC die is differently sized than the uniformly sized IC dies, and the second IC die comprises at least one of a repeater circuitry and a fanout structure in an electrical pathway coupling the first IC die with an adjacent IC die in the array.

Example 60 provides the IC package of example 59, in which: the second IC die comprises the repeater circuitry, and the second IC die is part of another array of smaller sized bridge dies.

Example 61 provides the IC package of example 59, in which: the first IC die is smaller than an adjacent IC die in the first layer, the second IC die comprises fanout structures, a first set of interconnects coupling the second IC die to the first IC die comprises a first number of interconnects with a first pitch, a second set of interconnects coupling the second IC die to the adjacent IC die comprises a second number of interconnects with a second pitch, the first number is equal to the second number, the first pitch is smaller than the second pitch, and the fanout structures comprise electrical routing between the first set of interconnects and the second set of interconnects.

Example 62 provides the IC package of any of examples 59-61, in which a RDL between the second layer and the third layer accommodates electrical routing for the differently sized first IC die.

Example 63 provides the IC package of any of examples 59-62, in which the first IC die has an incompatible communication interface with adjacent IC dies in the first layer, and the second IC die comprises a circuit for protocol translation that enables the first IC die to communicate with the adjacent IC dies.

Example 64 provides the IC package of any of examples 59-63, in which the second layer comprises dielectric with TDVs surrounding the second IC die.

Example 65 provides the IC package of example 64, in which the dielectric comprises inorganic material.

Example 66 provides the IC package of any of examples 59-65, in which the package substrate comprises one of a silicon interposer and an organic substrate.

Example 67 provides a server architecture comprising: an array of core complexes in individual IC dies in a first layer, electrically coupled along edges of the individual IC dies by bridge dies in a second layer not coplanar with the first layer, in which the array forms a modular tiled compute architecture, at least one IC die has a different footprint than other IC dies in the first layer, and at least one bridge die electrically coupled to the at least one IC die comprises at least one of a repeater circuitry and a fanout structure in an electrical pathway coupling the at least one IC die with an adjacent IC die in the first layer.

Example 68 provides the server architecture of example 67, in which: the at least one bridge die comprises the repeater circuitry, and the at least one bridge die is larger than adjacent bridge dies in the second layer.

Example 69 provides the server architecture of example 67, in which: the different footprint has a corresponding different routing, and an RDL between the second layer and a package substrate accommodates the different routing.

Example 70 provides the server architecture of example 67, in which: one of the core complexes is in another IC die that has an incompatible communication interface with other adjacent IC dies, and another one of the bridge dies electrically coupled to the another IC die comprises circuitry for protocol translation that enables the another IC die to communicate with adjacent IC dies.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly comprising:
a first plurality of integrated circuit (IC) dies arranged in an array of rows and columns in a first layer; and
a second plurality of IC dies in a second layer not coplanar with the first layer, wherein:
a first IC die in the first plurality is differently sized than surrounding IC dies in the first plurality, and
a second IC die in the second plurality coupled to the first IC die comprises a repeater circuitry in an electrical pathway coupling the first IC die with an adjacent IC die in the first plurality, wherein the repeater circuitry comprises an amplifier, and the second IC die is part of an array of bridge dies having smaller sizes than the surrounding IC dies in the first plurality.

2. The microelectronic assembly of claim 1, wherein:
the first IC die is larger than the surrounding IC dies, and
the second IC die is at least one of longer and wider than adjacent IC dies in the second plurality.

3. The microelectronic assembly of claim 1, wherein:
the second plurality of IC dies is embedded in a dielectric in the second layer, and
through-dielectric vias (TDVs) in the second layer provide electrical coupling between the first layer and a third layer.

4. The microelectronic assembly of claim 1, further comprising a redistribution layer (RDL) between the second layer and a package substrate.

5. The microelectronic assembly of claim 1, further comprising a third IC die in the first layer coupled mechanically to the second IC die, wherein the third IC die does not comprise any functional electrical circuits.

6. The microelectronic assembly of claim 1, wherein:
a third IC die in the first plurality of IC dies has an incompatible communication interface with adjacent IC dies in the first plurality, and
a fourth IC die in the second plurality of IC dies comprises a circuit for protocol translation that enables the third IC die to communicate with the adjacent IC dies.

7. The microelectronic assembly of claim 1, further comprising other IC dies in the first layer that are not part of the first plurality.

8. An IC package comprising:
a first IC die in a first layer;
a second IC die in a second layer between the first layer and a third layer; and
a package substrate in the third layer, wherein:
the first IC die is part of an array of uniformly sized IC dies in the first layer,
the first IC die is differently sized than the uniformly sized IC dies,
the second IC die is part of another array of bridge dies having smaller sizes than the array of uniformly sized IC dies; and
the second IC die comprises a repeater circuitry in an electrical pathway coupling the first IC die with an adjacent IC die in the array of uniformly sized IC dies, the repeater circuitry comprising an amplifier.

9. The IC package of claim 8, wherein a RDL between the second layer and the third layer accommodates electrical routing for the differently sized first IC die.

10. The IC package of claim 8, wherein:
the first IC die has a first interface for communication with an adjacent IC die,
the adjacent IC die has a second interface for communication with the first IC die,
the first interface and the second interface are incompatible, such that the first IC die cannot communicate with the adjacent IC die, and
the second IC die comprises a circuit for protocol translation between the first interface and the second interface, such that the first IC die is enabled to communicate with the adjacent IC die through the circuit.

11. The IC package of claim 8, wherein the second layer comprises a dielectric with TDVs surrounding the second IC die.

12. The IC package of claim 11, wherein the dielectric comprises inorganic material.

13. The IC package of claim 8, wherein the package substrate comprises one of a silicon interposer and an organic substrate.

14. A server architecture comprising:

an array of core complexes in individual IC dies in a first layer, electrically coupled along edges of the individual IC dies by bridge dies in a second layer not coplanar with the first layer, wherein:

the array forms a modular tiled compute architecture, at least one IC die has a different footprint than other IC dies in the first layer and a different routing from the other IC dies in the first layer, wherein an RDL between the second layer and a package substrate accommodates the different routing, and at least one bridge die electrically coupled to the at least one IC die comprises a repeater circuitry in an electrical pathway coupling the at least one IC die with an adjacent IC die in the first layer, the repeater circuitry configured to amplify a signal in the electrical pathway.

15. The server architecture of claim 14, wherein:

the at least one bridge die comprises the repeater circuitry, and the at least one bridge die is larger than adjacent bridge dies in the second layer.

16. The server architecture of claim 14, wherein:

one of the core complexes is in another IC die that has an incompatible communication interface with other adjacent IC dies, and another one of the bridge dies electrically coupled to the another IC die comprises circuitry for protocol translation that enables the another IC die to communicate with the other adjacent IC dies.

17. The IC package of claim 8, wherein the first IC die is larger than the uniformly sized IC dies.

18. The server architecture of claim 14, wherein the at least one IC die has a larger footprint than the other IC dies in the first layer.

19. The server architecture of claim 14, wherein the at least one bridge die in the second layer has a smaller footprint than the individual IC dies in the first layer.

20. The IC package of claim 8, wherein the first IC die has different routing from the uniformly sized IC dies.

* * * * *